(12) United States Patent
Kang

(10) Patent No.: US 9,385,129 B2
(45) Date of Patent: Jul. 5, 2016

(54) METHOD OF FORMING A MEMORY CAPACITOR STRUCTURE USING A SELF-ASSEMBLY PATTERN

(71) Applicant: Tokyo Electron Limited, Minato-ku, Tokyo (JP)

(72) Inventor: Hoyoung Kang, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/720,279

(22) Filed: May 22, 2015

(65) Prior Publication Data

US 2016/0141290 A1    May 19, 2016

Related U.S. Application Data

(60) Provisional application No. 62/079,197, filed on Nov. 13, 2014.

(51) Int. Cl.
| | |
|---|---|
| *H01L 21/00* | (2006.01) |
| *H01L 27/108* | (2006.01) |
| *H01L 21/311* | (2006.01) |
| *H01L 21/768* | (2006.01) |
| *H01L 21/31* | (2006.01) |
| *H01L 21/283* | (2006.01) |
| *H01L 23/532* | (2006.01) |
| *H01L 49/02* | (2006.01) |
| *H01L 23/522* | (2006.01) |
| *H01L 23/528* | (2006.01) |

(52) U.S. Cl.
CPC ............ *H01L 27/108* (2013.01); *H01L 21/283* (2013.01); *H01L 21/31* (2013.01); *H01L 21/31116* (2013.01); *H01L 21/31138* (2013.01); *H01L 21/76816* (2013.01); *H01L 23/528* (2013.01); *H01L 23/5222* (2013.01); *H01L 23/5329* (2013.01); *H01L 27/10844* (2013.01); *H01L 28/40* (2013.01)

(58) Field of Classification Search
CPC ............ H01L 27/108; H01L 27/10844; H01L 21/31138
See application file for complete search history.

(56) References Cited

U.S. PATENT DOCUMENTS

| | | | | |
|---|---|---|---|---|
| 7,544,563 | B2* | 6/2009 | Manning | H01L 27/0805 257/E21.396 |
| 7,785,962 | B2* | 8/2010 | Bhat | H01L 28/91 257/E21.019 |
| 7,902,081 | B2* | 3/2011 | Raghu | H01L 21/32134 216/104 |
| 7,947,907 | B2* | 5/2011 | Colburn | H01L 21/0271 174/250 |
| 8,134,823 | B2 | 3/2012 | Chen et al. | |
| 8,518,788 | B2* | 8/2013 | Lee | H01L 27/0207 257/E21.657 |
| 8,652,926 | B1 | 2/2014 | Lugani et al. | |
| 8,980,538 | B2* | 3/2015 | Somervell | G03F 7/0002 430/313 |
| 9,076,680 | B2* | 7/2015 | Busch | H01L 27/10852 |

(Continued)

*Primary Examiner* — Laura Menz

(74) *Attorney, Agent, or Firm* — Wood, Herron & Evans, LLP

(57) ABSTRACT

A capacitor structure and method of forming thereof on a substrate is described. The capacitor structure includes a substrate having a plurality of capacitor electrodes formed within an insulative retaining material, and a collar layer structure in contact with the plurality of capacitor electrodes, wherein the collar layer structure interconnects the plurality of capacitor electrodes and exposes the underlying insulative retaining material through openings having an unguided, random self-assembly pattern. Furthermore, the insulative retaining material may be removed from the capacitor structure. The method includes using a self-assembly process to form the interconnecting collar layer structure.

20 Claims, 9 Drawing Sheets

(56) References Cited

U.S. PATENT DOCUMENTS

| | | | |
|---|---|---|---|
| 2003/0134436 A1* | 7/2003 | Yates | H01L 27/1085 438/1 |
| 2006/0121672 A1* | 6/2006 | Basceri | H01L 27/10817 438/243 |
| 2006/0211211 A1* | 9/2006 | Sandhu | H01L 27/0805 438/386 |
| 2006/0261440 A1* | 11/2006 | Manning | H01L 27/0805 257/532 |
| 2006/0263968 A1* | 11/2006 | Manning | H01L 28/91 438/238 |
| 2007/0207622 A1* | 9/2007 | Rana | H01L 21/31111 438/745 |
| 2007/0238259 A1* | 10/2007 | Bhat | H01L 27/10852 438/381 |
| 2008/0176767 A1* | 7/2008 | Millward | B81C 1/00031 506/20 |
| 2008/0193658 A1* | 8/2008 | Millward | B81C 1/00031 427/401 |
| 2008/0206950 A1* | 8/2008 | Bhat | H01L 28/91 438/397 |
| 2008/0299353 A1* | 12/2008 | Stoykovich | B81C 1/00031 428/195.1 |
| 2009/0200646 A1* | 8/2009 | Millward | B81C 1/00031 257/632 |
| 2009/0263628 A1* | 10/2009 | Millward | B05D 1/34 428/173 |
| 2010/0316849 A1* | 12/2010 | Millward | B81C 99/009 428/195.1 |
| 2011/0147985 A1* | 6/2011 | Cheng | G03F 7/0392 264/225 |
| 2012/0164392 A1* | 6/2012 | Stoykovich | B81C 1/00031 428/172 |
| 2014/0205818 A1* | 7/2014 | Schwartz | G03F 7/16 428/201 |
| 2014/0272723 A1* | 9/2014 | Somervell | G03F 7/0002 430/325 |
| 2014/0333177 A1* | 11/2014 | Guillou | H01L 41/0533 310/321 |

\* cited by examiner

METHOD OF FORMING A MEMORY CAPACITOR STRUCTURE USING A SELF-ASSEMBLY PATTERN

BACKGROUND OF THE INVENTION

1. Field of Invention

The invention relates to a capacitor structure and a method for forming the capacitor structure on a substrate.

2. Description of Related Art

Capacitors are one type of component commonly used in the fabrication of integrated circuits, for example in DRAM and other memory circuitry. A capacitor is comprised of two conductive electrodes separated by a non-conducting dielectric region. As integrated circuitry density has increased, there is a continuing challenge to maintain sufficiently high storage capacitance despite decreasing capacitor area. The increase in density has typically resulted in greater reduction in the horizontal dimension of capacitors as compared to the vertical dimension. In many instances, the vertical dimension of capacitors has increased.

One manner of fabricating capacitors is to initially form an insulative material within which a capacitor storage node electrode is formed. For example, an array of capacitor electrode openings for individual capacitors may be fabricated in such insulative capacitor electrode-forming material, with an example material being silicon dioxide doped with one or both of phosphorus and boron. The capacitor electrode openings may be formed by etching. It can be difficult to etch such openings within the insulative material, particularly where the openings are deep.

Furthermore, it is often desirable to etch away most if not all of the capacitor electrode-forming material after individual capacitor electrodes have been formed within the openings. Such removal enables outer sidewall surfaces of the electrodes to provide increased area and thereby increased capacitance for the capacitors being formed. However, capacitor electrodes formed in deep openings are often correspondingly much taller than they are wide, i.e., large aspect ratio features. This can lead to toppling of the capacitor electrodes, either (i) during etching to expose the outer sidewall surfaces, (ii) during transport of the substrate, and/or (iii) during deposition of the capacitor dielectric layer and/or outer capacitor electrode layer, among others. Techniques for providing structural support are required to be integrated with the fabrication of the capacitor electrodes to prevent the toppling of electrodes.

SUMMARY OF THE INVENTION

Embodiments of the invention relate to a capacitor structure and a method for forming the capacitor structure on a substrate.

According to an embodiment, a capacitor structure and method of forming thereof on a substrate is described. The capacitor structure includes a substrate having a plurality of capacitor electrodes formed within an insulative retaining material, and a collar layer structure in contact with the plurality of capacitor electrodes, wherein the collar layer structure interconnects the plurality of capacitor electrodes and exposes the underlying insulative retaining material through openings having an unguided, random self-assembly pattern. Furthermore, the insulative retaining material may be removed from the capacitor structure. The method includes using a self-assembly process to form the interconnecting collar layer structure.

According to another embodiment, a method of forming a capacitor structure is described. The method includes providing a substrate having a plurality of capacitor electrodes formed within an insulative retaining material, wherein the substrate further includes a collar layer in contact with the plurality of capacitor electrodes. The method further includes preparing a self-assembled layer on the collar layer, wherein the self-assembled polymer layer has a first domain phase-separated from a second domain; selectively removing the first domain of the self-assembled polymer layer while retaining the second domain of the self-assembled polymer layer to form an unguided, random self-assembly pattern on the substrate; and transferring the unguided, random self-assembly pattern into and through the collar layer to create a collar layer structure interconnecting the plurality of capacitor electrodes that has openings there through exposing the underlying insulative retaining material.

According to another embodiment, a capacitor structure is described. The capacitor structure includes a substrate having a plurality of capacitor electrodes formed within an insulative retaining material, and a collar layer structure in contact with the plurality of capacitor electrodes, wherein the collar layer structure interconnects the plurality of capacitor electrodes and exposes the underlying insulative retaining material through openings having an unguided, random self-assembly pattern.

According to yet another embodiment, a capacitor structure is described. The capacitor structure includes a substrate having a plurality of capacitor electrodes and a collar layer structure in contact with the plurality of capacitor electrodes, wherein the collar layer structure interconnects the plurality of capacitor electrodes while providing openings there through having an unguided, random self-assembly pattern.

DETAILED DESCRIPTION OF SEVERAL EMBODIMENTS

Figure 1A:
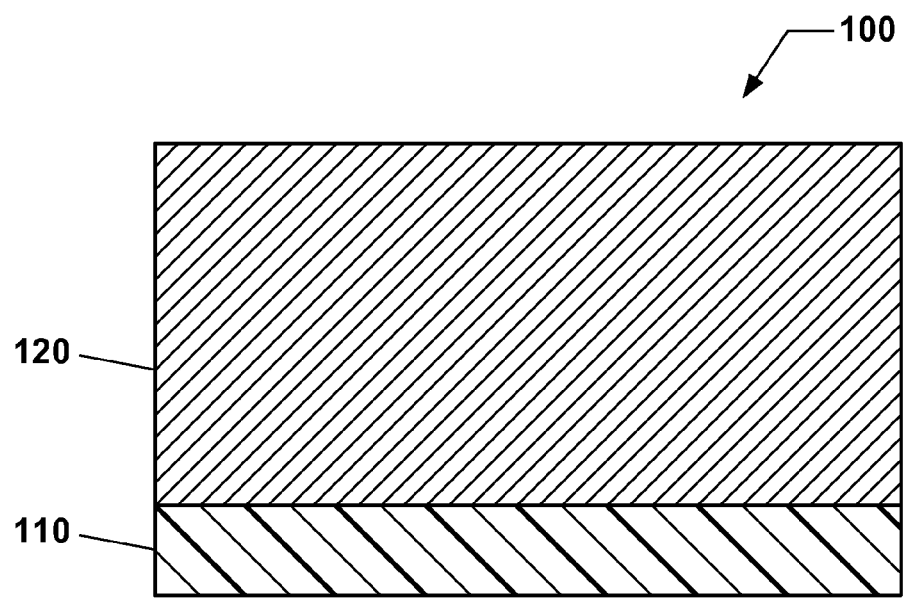
FIGS. 1A through 1J provide a series of cross-sectional and top-down views that illustrate a method of forming a capacitor structure.

In the following description, for purposes of explanation and not limitation, specific details are set forth, such as a particular geometry of a capacitor structure, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As used herein, the term "radiation sensitive material" means and includes photosensitive materials such as photoresists.

As used herein, the term "polymer block" means and includes a grouping of multiple monomer units of a single type (i.e., a homopolymer block) or multiple types (i.e., a copolymer block) of constitutional units into a continuous polymer chain of some length that forms part of a larger polymer of an even greater length and exhibits a $\chi N$ value, with other polymer blocks of unlike monomer types, that is sufficient for phase separation to occur. $\chi$ is the Flory-Huggins interaction parameter and N is the total degree of polymerization for the block copolymer. According to embodiments of the present invention, the $\chi N$ value of one polymer block with at least one other polymer block in the larger copolymer may be equal to or greater than about 10.5.

As used herein, the term "block copolymer" means and includes a polymer composed of chains where each chain contains two or more polymer blocks as defined above and at least two of the blocks are of sufficient segregation strength (e.g., $\chi N > 10.5$) for those blocks to phase separate. A wide variety of block polymers are contemplated herein including di-block copolymers (i.e., polymers including two polymer blocks (AB)), tri-block copolymers (i.e., polymers including three polymer blocks (ABA or ABC)), multi-block copolymers (i.e., polymers including more than three polymer blocks (ABCD, etc.)), and combinations thereof.

The terms "microphase separation" and "microphase segregation", as used herein, means and includes the properties by which homogeneous blocks of a block copolymer aggregate mutually, and heterogeneous blocks separate into distinct domains. In the bulk, block copolymers can self-assemble into ordered or dis-ordered morphologies, having a variety of domain shapes, wherein the molecular weight of the block copolymer dictates the size of the micro-domains formed.

The domain size or pitch period ($L_o$) of the self-assembled block copolymer morphology may be used as a basis for designing critical dimensions of the patterned structure. Similarly, the structure period ($L_s$), which is the dimension of the feature remaining after selectively etching away one of the polymer blocks of the block copolymer, may be used as a basis for designing critical dimensions of the patterned structure. The lengths of each of the polymer blocks making up the block copolymer may be an intrinsic limit to the sizes of domains formed by the polymer blocks of those block copolymers. For example, each of the polymer blocks may be chosen with a length that facilitates self-assembly into a desired pattern of domains, and shorter and/or longer copolymers may not self-assemble as desired.

The term "annealing" or "anneal", as used herein, means and includes treatment of the block copolymer so as to enable sufficient microphase segregation between the two or more different polymeric block components of the block copolymer to form an ordered pattern defined by repeating structural units formed from the polymer blocks. Annealing of the block copolymer in the present invention may be achieved by various methods known in the art, including, but not limited to: thermal annealing (either in a vacuum or in an inert atmosphere, such as nitrogen or argon), solvent vapor-assisted annealing (either at or above room temperature), supercritical fluid-assisted annealing, or absorption-based annealing (e.g., optical baking). As a specific example, thermal annealing of the block copolymer may be conducted by exposing the block copolymer to an elevated temperature that is above the glass transition temperature ($T_g$), but below the degradation temperature ($T_d$) of the block copolymer, as described in greater detail hereinafter. Other conventional annealing methods not described herein may also be utilized.

The ability of block copolymers to self-organize may be used to form mask patterns. Block copolymers are formed of two or more chemically distinct blocks. For example, each block may be formed of a different monomer. The blocks are immiscible or thermodynamically incompatible, e.g., one block may be polar and the other may be non-polar. Due to thermodynamic effects, the copolymers will self-organize in solution to minimize the energy of the system as a whole; typically, this causes the copolymers to move relative to one another, e.g., so that like blocks aggregate together, thereby forming alternating regions containing each block type or species. For example, if the copolymers are formed of polar (e.g., organometallic containing polymers) and non-polar blocks (e.g., hydrocarbon polymers), the blocks will segregate so that non-polar blocks aggregate with other non-polar blocks and polar blocks aggregate with other polar blocks. It will be appreciated that the block copolymers may be described as a self-assembling material since the blocks can move to form a pattern without active application of an external force to direct the movement of particular individual molecules, although heat may be applied to increase the rate of movement of the population of molecules as a whole.

As noted above, the extreme aspect ratio of current capacitor structures, their close spacing, and the lack of structural support poses challenges during integration. For example, the etching process to remove the support material for the first electrode and/or the subsequent deposition processes to form the capacitor dielectric or second electrode can cause the upright, free-standing capacitor structure to topple. Therefore, exemplary embodiments for forming capacitor structures are provided and described.

Referring now to the drawings, wherein like reference numerals designate identical or corresponding parts throughout the several views, FIGS. 1A through 1J illustrate a method for forming a capacitor structure 100. As is understood to one of ordinary skill in the art, the fabrication of capacitors in memory circuitry may include forming an array of capacitors within a capacitor array area. A control or other circuitry area is often displaced from the capacitor array area, and the substrate may include an intervening area between the capacitor array area and the control or other circuitry area. In some instances, a trench is formed in the intervening area between the capacitor array area and the other circuitry area. Such a trench may be formed commensurate with the fabrication of the openings within the capacitor array area within which the isolated capacitor electrodes will be received. However, for simplicity, the drawings focus on the illustration of exemplary capacitor structures formed according to the method described herein.

Figure 1B:
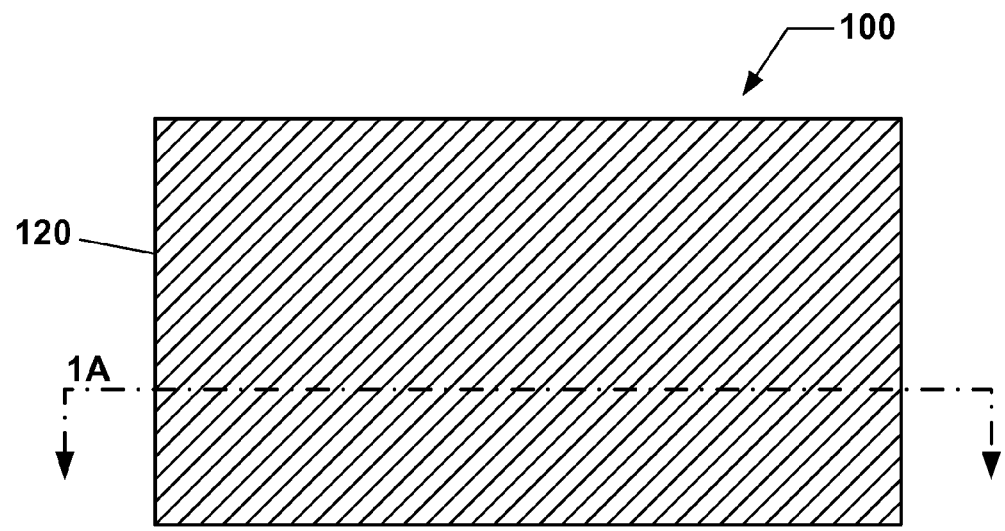

As shown in FIGS. 1A and 1B, a cross-sectional view (FIG. 1A) and top-down view (FIG. 1B) are provided of the substrate 110 during an early phase of fabrication of the capacitor structure 100. Substrate 110 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof. Substrate 110 can be of any size, for example a 200 mm (millimeter) substrate, a 300 mm substrate, or an even larger substrate.

Insulative retaining material 120 may be homogeneous or non-homogeneous in composition. For example, the insulative retaining material 120 can include one or more of doped or undoped silicon, carbon, polyimide, and oxide, such as silicon oxide. Preferably, the insulative retaining material 120 is polycrystalline silicon (polysilicon) or silicon oxide. An examplary thickness for the insulative retaining material can range from about 1,000 Angstroms to about 20,000 Angstroms.

Figure 1C:
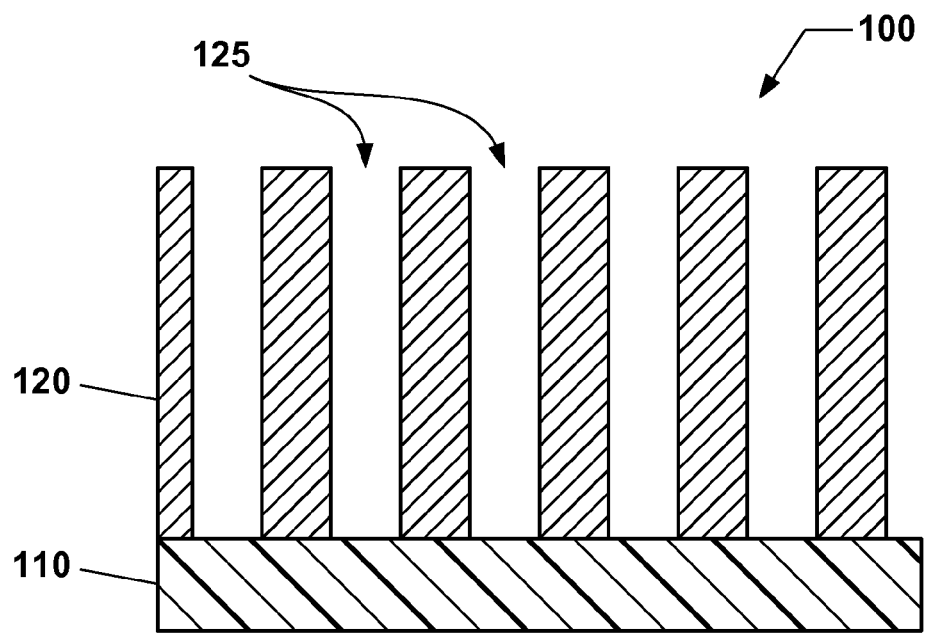
Figure 1D:
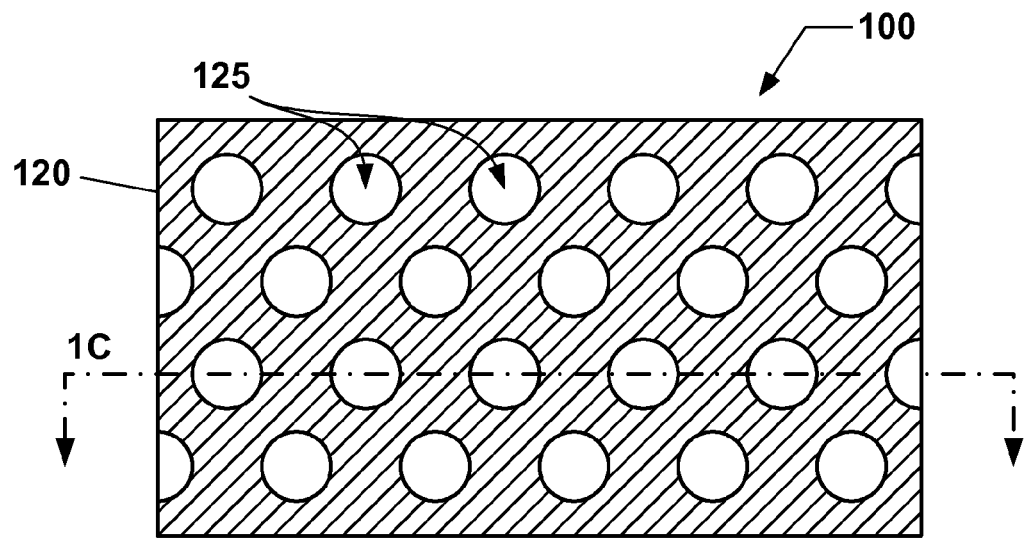

As shown in FIGS. 1C and 1D, a cross-sectional view (FIG. 1C) and top-down view (FIG. 1D) are provided of the capacitor structure 100 being formed on the substrate 110 following the fabrication of capacitor openings 125 in the insulative retaining material 120. The capacitor openings 125 may possess a cylindrical shape characterized by a diameter and a height. For example, an aspect ratio of at least one capacitor opening 125, measured as the ratio of the height to the diameter, can exceed 5-to-1, or it can exceed 10-to-1, or even 100-to-1. The capacitor openings 125 can be formed using photo-lithography and one or more etching processes. When anisotropically etching silicon oxide, a dry plasma etching process using, for example, a halocarbon or halomethane gas (e.g., $C_xF_yH_z$, where x and y are real numbers greater than zero, and z is a real number greater than or equal to zero). Additionally, when anisotropically etching polysilicon, a dry plasma etching process using, for example, a halogen-containing or halide gas (e.g., HBr, $Cl_2$, $SF_6$, $NF_3$, etc.). An additive gas, such as $O_2$, may also be included.

Figure 1E:
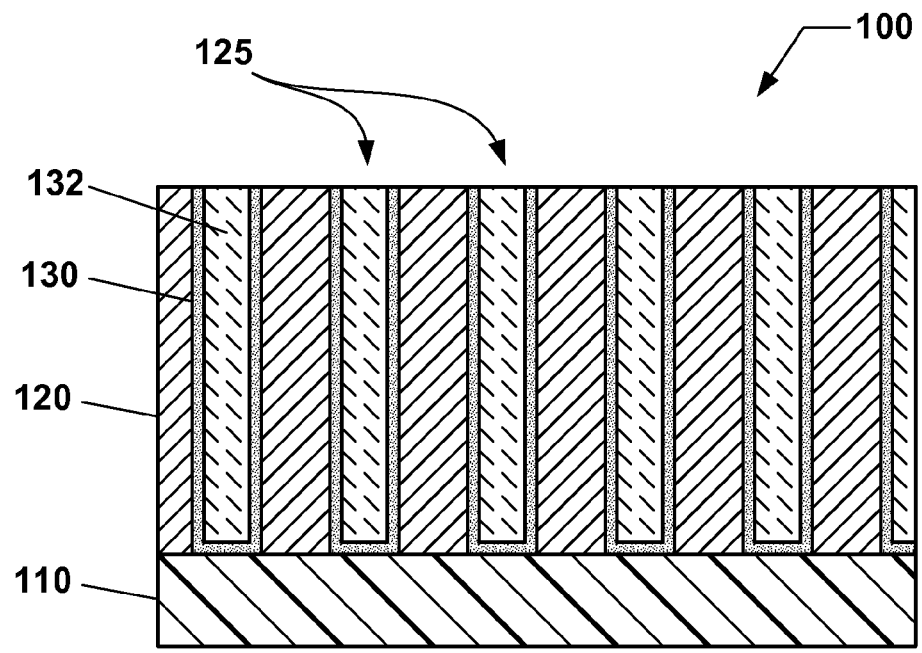
Figure 1F:
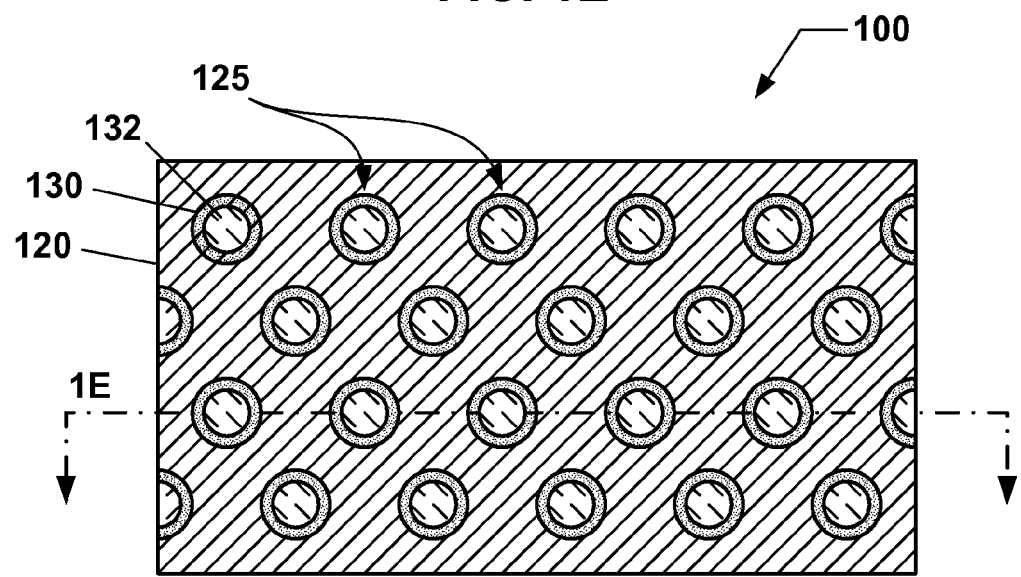

As shown in FIGS. 1E and 1F, a cross-sectional view (FIG. 1E) and top-down view (FIG. 1F) are provided of the capacitor structure 100 being formed on the substrate 110 following the formation of the plural capacitor electrodes 130 in the capacitor openings 125. The capacitor openings 125 can be lined with the capacitor electrode 130, filled with an insulative filling material 132, and the over-burden may be planarized back to the upper surface of the insulative retaining material 120, as depicted in FIG. 1E. While not shown, the capacitor electrodes 130 have been formed within the capacitor openings 125 in the insulative retaining material 120 in conductive electrical connection with respective node locations fabricated on substrate 110. The insulative filler material 132 may or may not be the same composition as the insulative retaining material 120. The insulative filler material 132 can include one or more of doped or undoped silicon, carbon, polyimide, and oxide, such as silicon oxide. Preferably, the insulative filler material 132 is polycrystalline silicon (polysilicon) or silicon oxide.

The capacitor electrodes 130 may be homogenous or non-homogenous, and they may be of any suitable shape(s) including, but not limited to, a solid pillar-like shape having a cylindrical shape. Alternatively, as shown in FIG. 1E, the capacitor electrodes 130 may be cylindrically shaped cans or upwardly open containers. As noted above, the capacitor electrodes 130 may be formed by depositing one or more conductive materials to overfill capacitor openings 125, followed by planarizing the conductive material back at least to the outermost surface of insulative retaining material 120. The deposition process may include physical vapor deposition (PVD), chemical vapor deposition (CVD), or atomic layer deposition (ALD), or combinations thereof. Exemplary conductive materials include titanium, titanium nitride, and ruthenium, and combinations thereof.

Figure 1G:
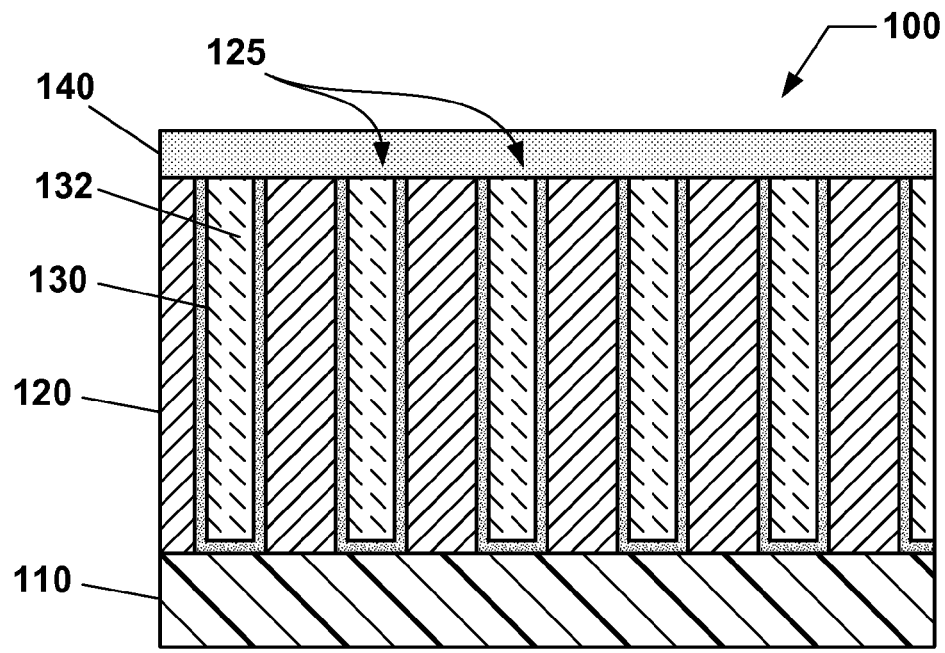
Figure 1H:
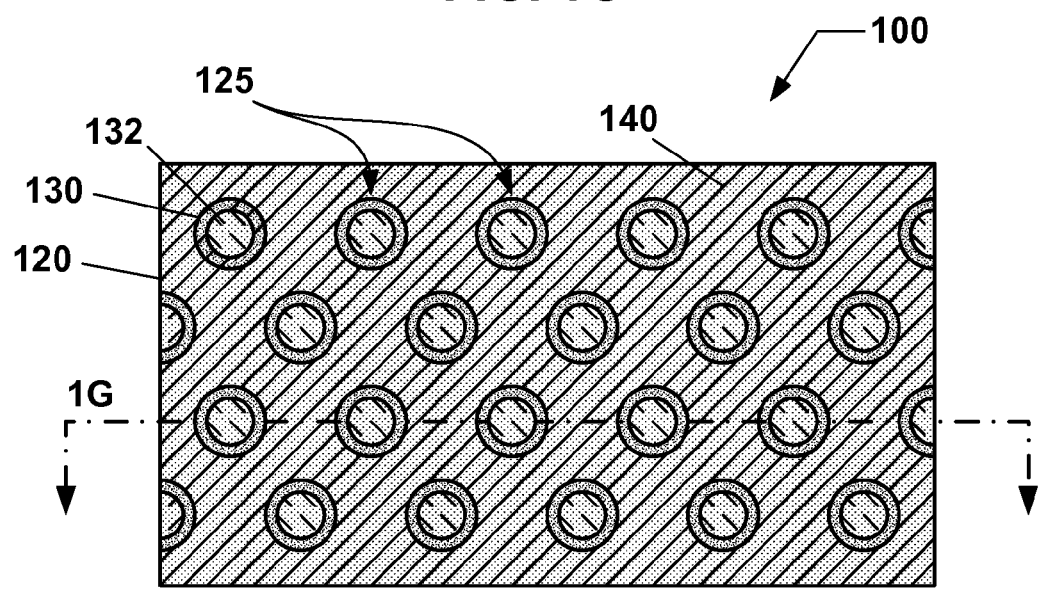

As shown in FIGS. 1G and 1H, a cross-sectional view (FIG. 1G) and top-down view (FIG. 1H) are provided of the capacitor structure 100 being formed on the substrate 110 following the formation of the collar layer 140 in contact with the capacitor electrodes 130. The collar layer 140 can be a spin-on or vapor deposited layer. For example, the collar layer 140 can be deposited using CVD techniques. The collar layer 140 can include a silicon-containing or carbon-containing material. As an example, the collar layer 140 is silicon nitride.

Using conventional lithographic techniques, the collar layer 140 can be patterned to create structural support for the capacitor electrodes 130, and expose the insulative retaining material 120, as well as the insulative filler material 132. Photolithography is a standard technique used to manufacture semiconductor integrated circuitry by transferring geometric shapes and patterns on a mask to the surface of a semiconductor wafer. Current state-of-the-art photolithography tools allow minimum feature sizes down to about 25 nm and less.

Figure 1I:
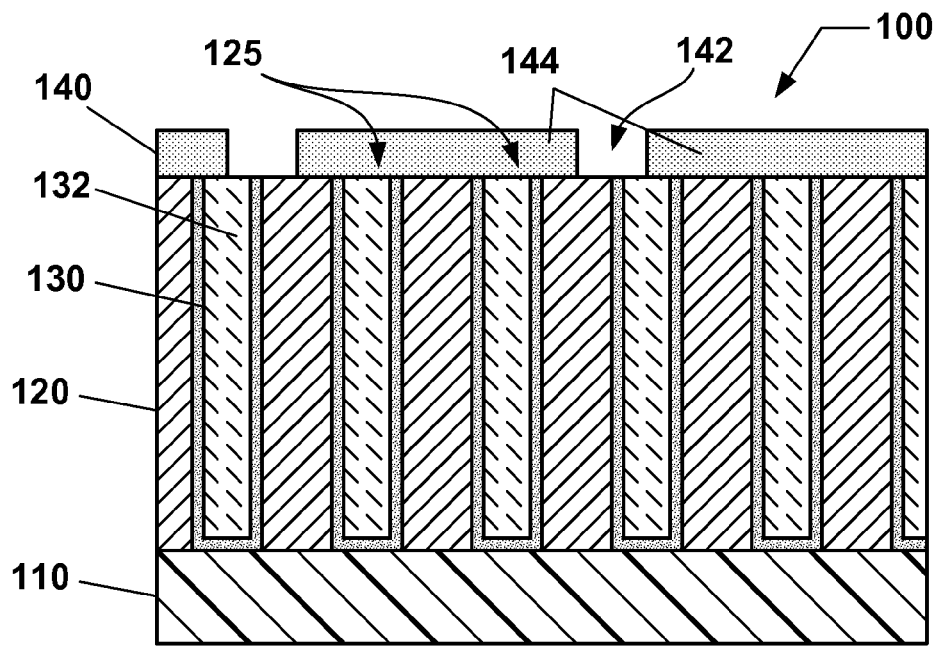
Figure 1J:
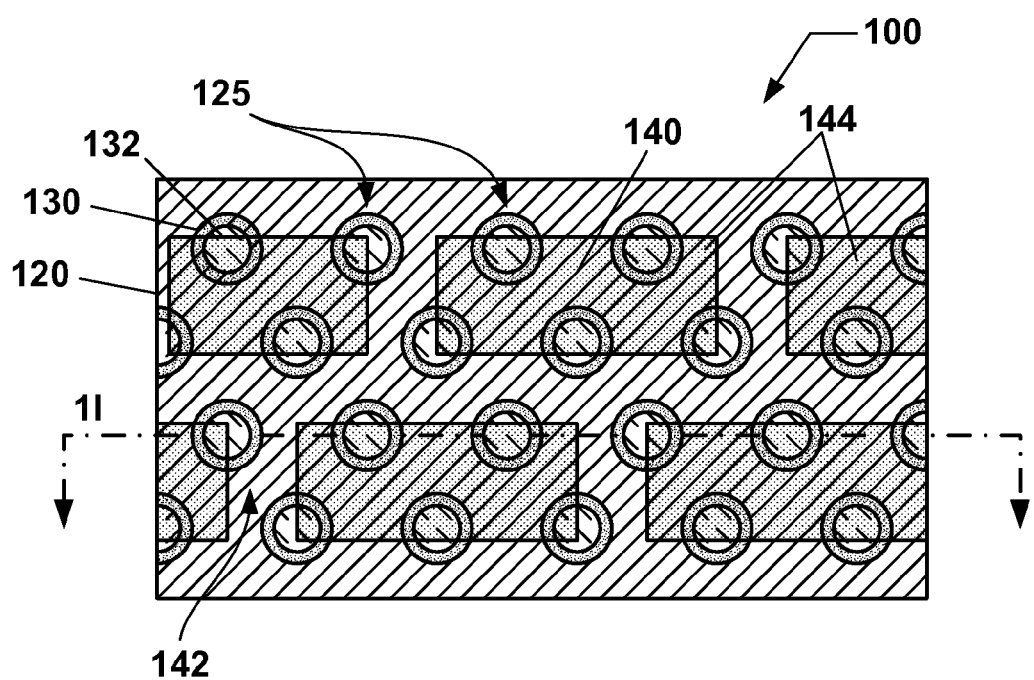

As shown in FIGS. 1I and 1J, a cross-sectional view (FIG. 1I) and top-down view (FIG. 1J) are provided to illustrate a conventional method of patterning the collar layer 140 that provides structural support to the capacitor structure 100 on the substrate 110. Therein, the collar layer 140 is patterned using conventional lithographic techniques to create a collar pattern 144 with open pattern 142. The lithographic technique may include applying a radiation sensitive material to an upper surface of the collar layer. One or more intermediate layers, such as an anti-reflective coating (ARC), may be disposed between the radiation sensitive material and the collar layer 140. Thereafter, pattern exposure in a photo-lithography module, followed by developing in a track module, can produce the collar pattern. However, with the reduction of the physical size of the capacitors, as well as the reduction in their spacing, high resolution lithography is required to accurately and precisely locate the collar pattern 144 in contact with the capacitor electrodes 130. And, this requirement makes the patterning process extremely challenging.

Now, to overcome the patterning challenges noted above, among others, a method of forming a capacitor structure 200 is described in FIGS. 2A through 2F, and FIG. 3, according to an embodiment. The method is illustrated in a flow chart 300, and begins in 310 with providing substrate 110 having the plurality of capacitor electrodes 130 formed within the insulative retaining material 120, wherein the substrate 110 further includes the collar layer 140 in contact with the plurality of capacitor electrodes 130.

Figure 2A:
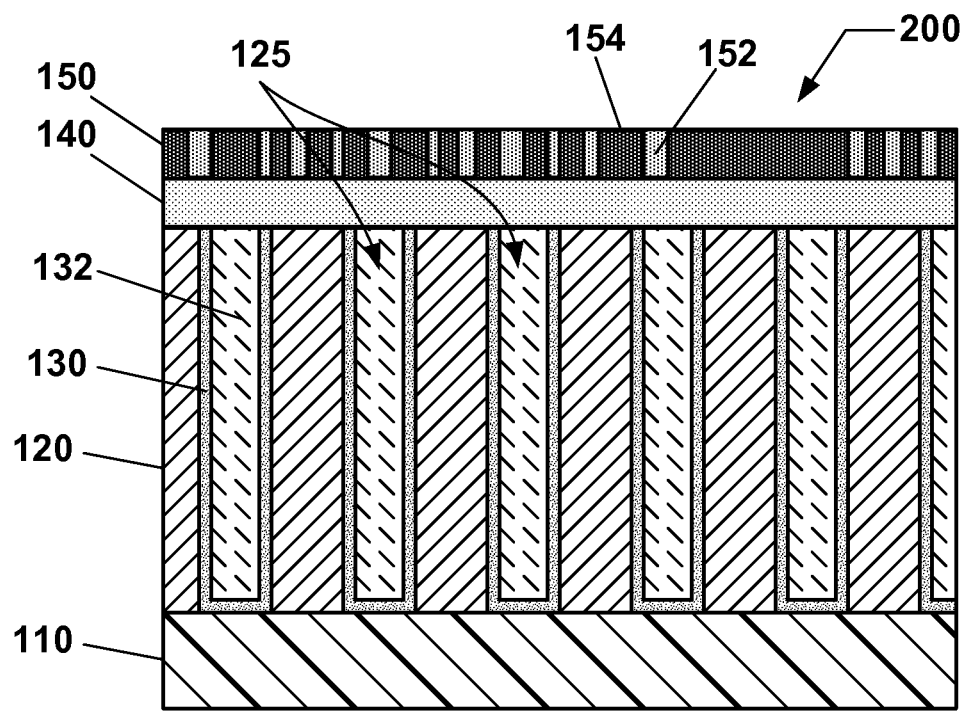
FIGS. 2A through 2F provide a series of cross-sectional and top-down views that illustrate a method of forming a capacitor structure according to an embodiment.
Figure 2B:
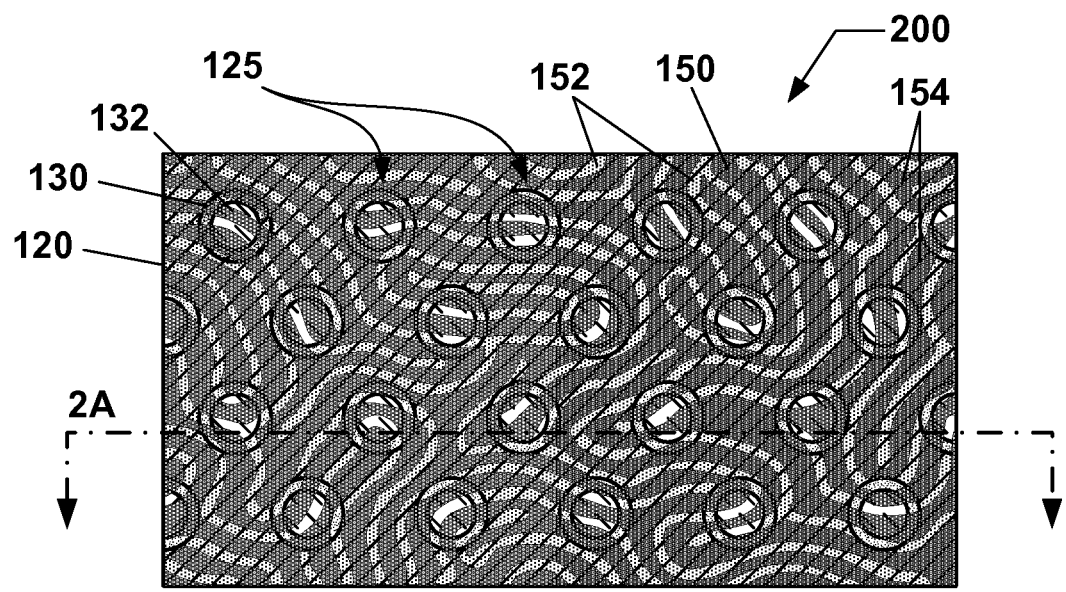

As shown in FIGS. 2A and 2B, a cross-sectional view (FIG. 2A) and top-down view (FIG. 2B) are provided to illustrate the patterning of the collar layer 140 using a self-assembled polymer layer 150 to provide structural support and expose the insulative retaining material 120, as well as the insulative filler material 132. In 312, the self-assembled polymer layer 150, which may include a self-assembled block copolymer layer, is prepared on the collar layer 140, wherein the self-assembled polymer layer 150 has a first domain 152 composed of a first polymer block phase-separated from a second domain 154 composed of a second polymer block. Thereafter, in 314, the first domain 152 of the self-assembled polymer layer 150 is selectively removed while retaining the second domain 154 of the self-assembled polymer layer 150 to form an unguided, random self-assembly pattern 155 on the substrate 110.

During self-assembly, block copolymers are compounds that undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1 nm to 5 nm and may be manipulated by modification of the chemical compositions of the blocks of the copolymer.

A block copolymer may form many different phases upon self-assembly, dependent upon the volume fractions of the blocks, degree of polymerization within each block type (i.e., number of monomers of each respective type within each respective block), the optional use of a solvent and surface interactions. When applied in a thin film without physical or chemical guidance, the phase separation of the block copolymers can lead to the random, unguided pattern (e.g., "finger print-like" pattern) illustrated in the top-down view of FIG. 2A.

The block copolymer may be deposited by various methods, including, e.g., spin-on coating, spin casting, brush coating or vapor deposition. For example, the block copolymer may be provided as a solution in a carrier solvent such as an organic solvent, e.g., toluene. The solution of the block copolymer can be applied to the layered structure and the carrier solvent subsequently removed to provide the block copolymer. While the invention is not bound by theory, it will be appreciated that the different block species are understood to undergo micro-phase separation and self-aggregate due to thermodynamic considerations in a process similar to the domain separation of materials.

The micro-phase separation of domains during the forming of the self-assembled polymer layer 150 is accomplished by exposing to annealing conditions to facilitate the self-assembly of the block copolymer into a plurality of alternating domains, i.e. first and second domains. The temperature of the annealing process may be chosen to be sufficiently low to prevent adversely affecting the block copolymers. The anneal may be performed at a temperature of less than about 150° C., less than about 300° C., less than about 250° C., less than about 200° C. or about 180° C. in some embodiments. According to another embodiment, the annealing process may include a solvent anneal, which generally reduces the annealing temperature. Traditional solvent annealing methods can be used.

According to one aspect, in order to facilitate faster annealing times without oxidizing or burning the organic polymer block of the block copolymer, the annealing may be performed in a low oxygen atmosphere at annealing temperature greater than about 250° C. in less than about 1 hour of anneal time. As used herein, the low oxygen atmosphere comprises less than about 50 ppm oxygen. For example, the low oxygen atmosphere may include less than about 45 ppm, less than about 40 ppm, less than about 35 ppm, less than about 30 ppm, less than about 25 ppm, less than about 20 ppm, or ranges in between thereof. Additionally, the low oxygen atmosphere annealing methods may be accompanied by thermal quenching methods.

The anneal time may range from about several hours to about 1 minute. For example, annealing times for temperatures above 250° C. may range from about 1 hour to about 2 minutes, from about 30 minutes to about 2 minutes, or from about 5 minutes to about 2 minutes.

According to one embodiment, the annealing temperature may be within the range from about 260° C. to about 350° C., wherein the low oxygen atmosphere comprises less than about 40 ppm oxygen. For example, the layer of the block copolymer 180 may be exposed to annealing conditions of 310° C. in less than about 40 ppm oxygen for about a 2 minutes to about 5 minutes.

One example of a block copolymer is polystyrene-b-poly (methyl methacrylate) (PMMA). However, when removing the PMMA portion from the polystyrene-b-poly(methyl methacrylate) (PS-b-PMMA) layer to leave behind a polystyrene (PS) pattern, conventional etching techniques have suffered. Due to the organic nature of both materials, and their chemical similarities, developing an etch chemistry with suitable etch selectivity has been challenging.

Figure 2C:
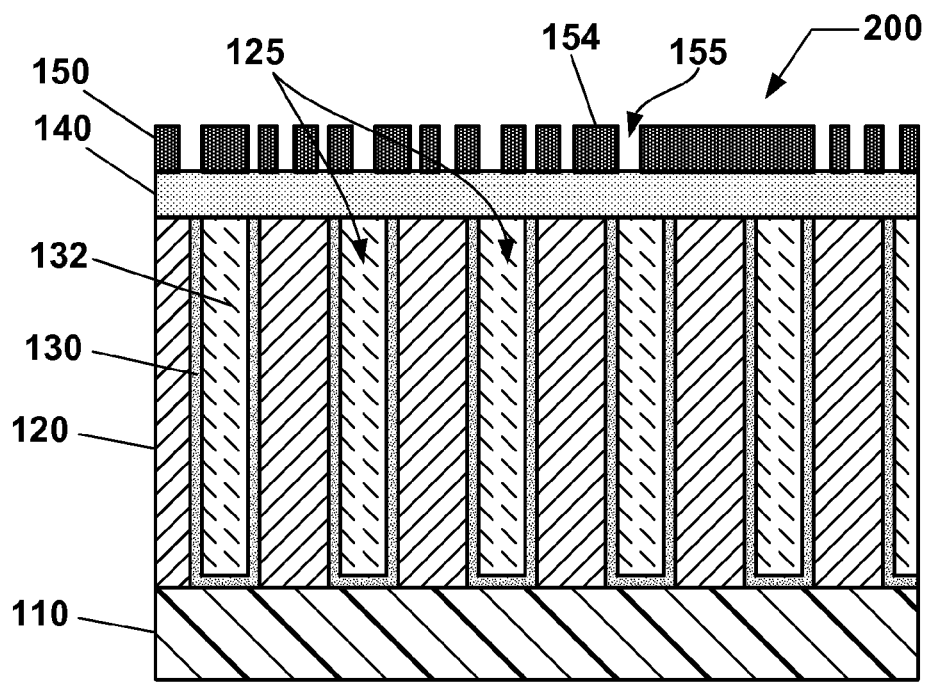
Figure 2D:
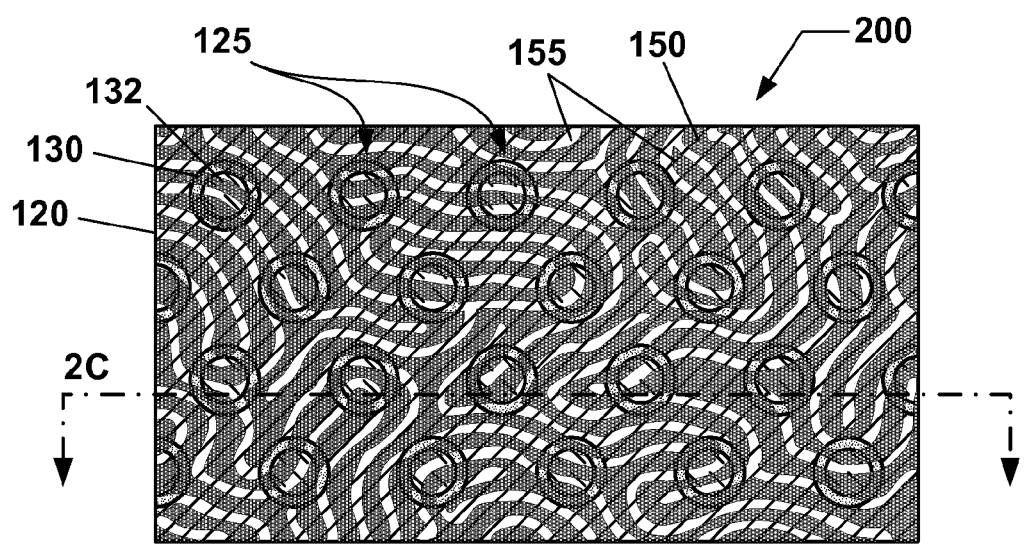

As shown in FIGS. 2C (cross-sectional view) and 2D (top-down view), the selective removal of at least one phase (i.e., the first domain 152) in the self-assembled polymer layer 150 is performed using dry anisotropic etching to leave behind on substrate 110 at least another phase (i.e., the second domain 154). During dry anisotropic etching, a plasma etching process can be utilized, wherein plasma is formed from a process composition by coupling electro-magnetic (EM) energy, such as radio frequency (RF) power, to the process composition in order to heat electrons and cause subsequent ionization and dissociation of the atomic and/or molecular constituents of the process composition. Using a series of dry etching processes, the initial pattern may be formed in the self-assembled polymer layer 150, followed by transfer of the pattern to the underlying layers. To do so, the selective removal of one material relative to other material(s) is necessary. In one embodiment, the process composition can include an oxygen-containing gas, such as O, $O_2$, $O_3$, CO, $CO_2$, NO, $N_2O$, $NO_2$, etc., and a noble gas, such as Ar or He. The process composition may further include a halogen-containing gas and an optional additive gas having: C and F; C, H, and F; or N and F, as atomic constituents. The halogen-containing gas may include one or more gases selected from the group consisting of $Cl_2$, $Br_2$, HBr, HCl, and $BCl_3$. RF power may or may not be pulsed.

Figure 2E:
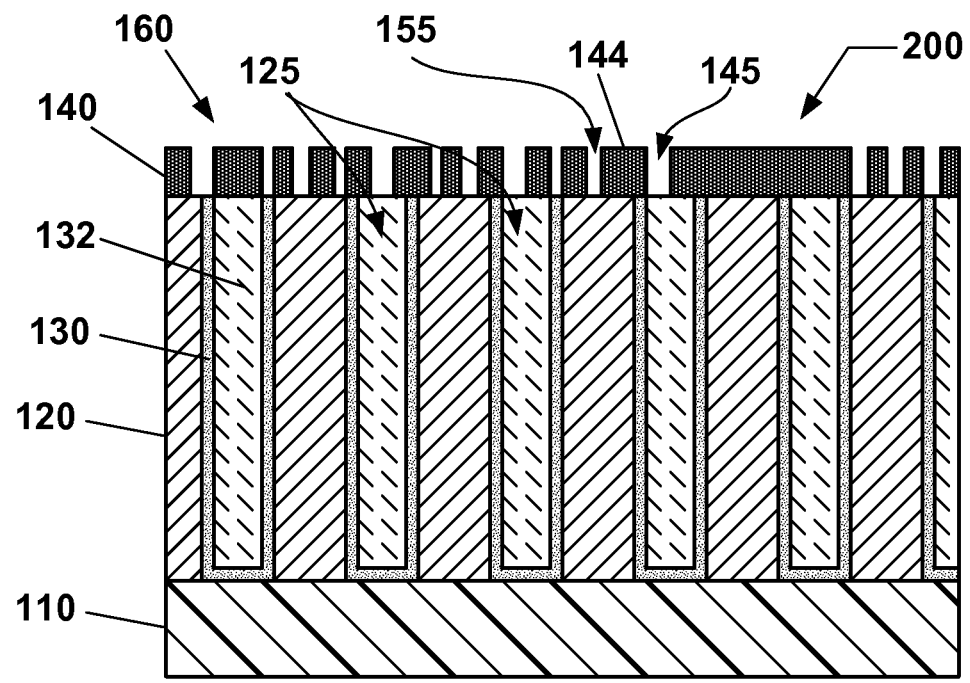
Figure 2F:
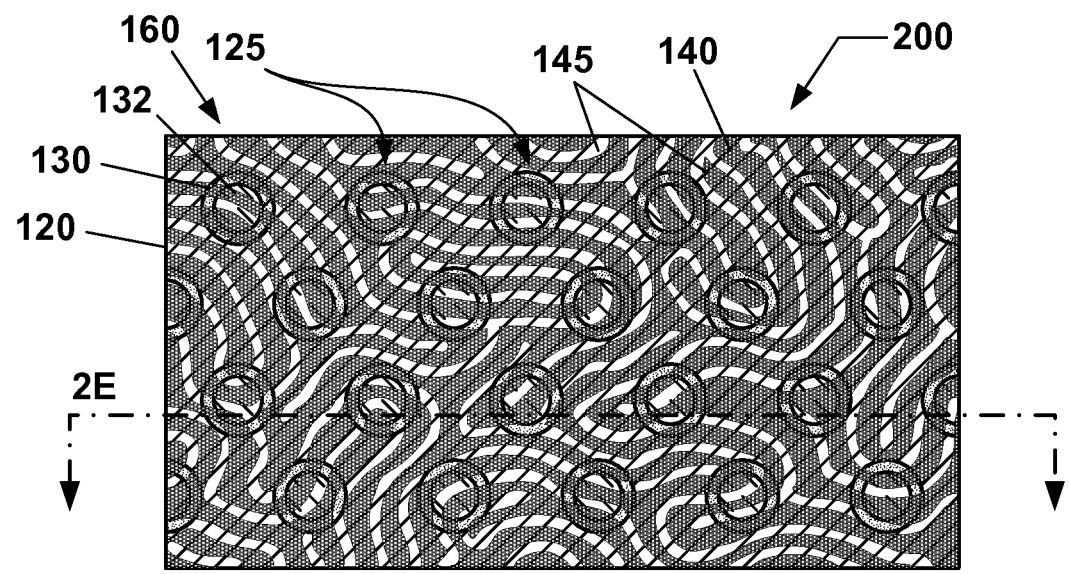
Figure 3:
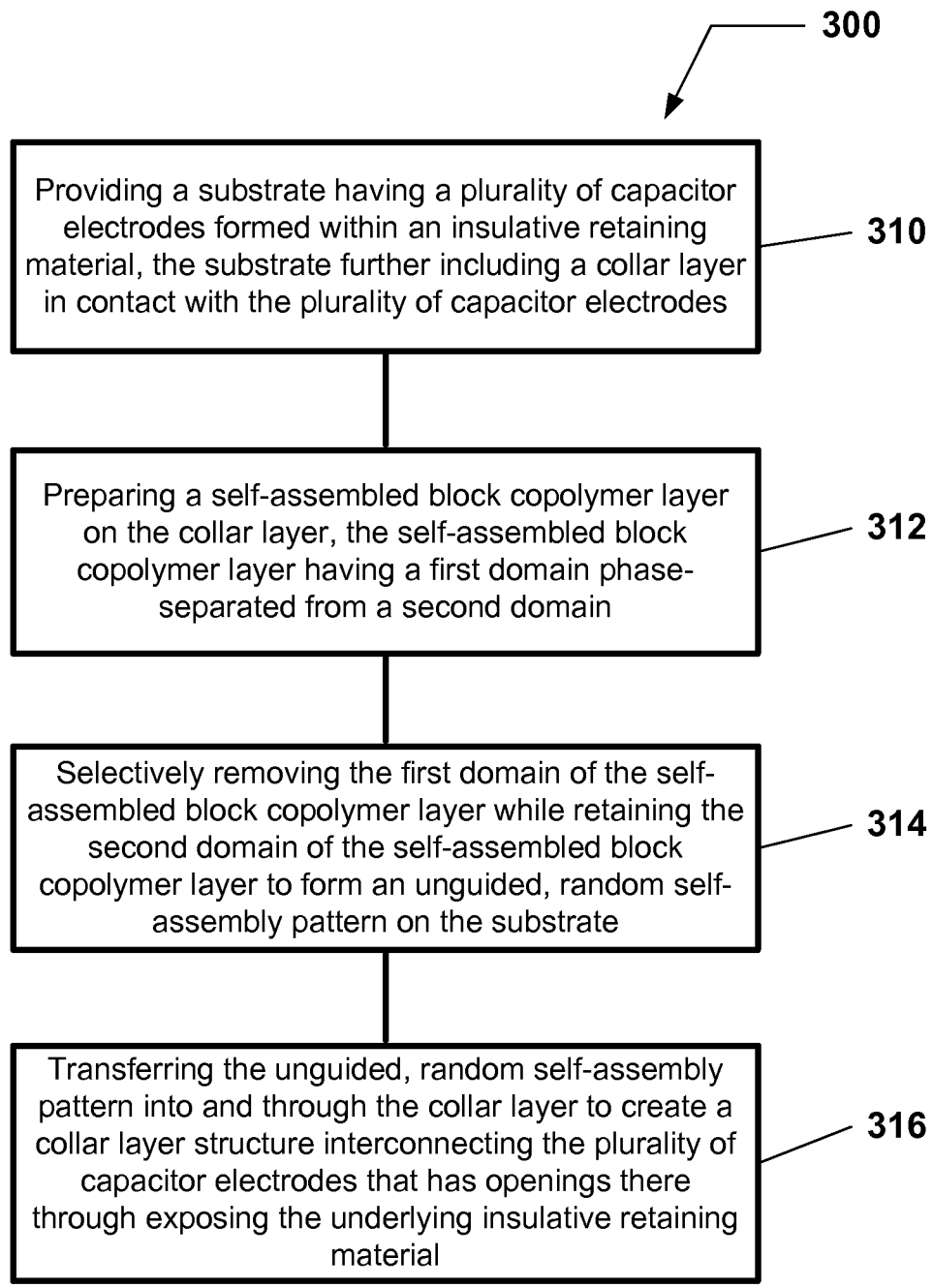
FIG. 3 provides a flow chart illustrating a method of forming a capacitor structure according to an embodiment.

As shown in FIGS. 2E (cross-sectional view) and 2F (top-down view), and FIG. 3, in 316, the unguided, random self-assembly pattern 144 is transferred into and through the collar layer 140 to create a collar layer structure 145 interconnecting the plurality of capacitor electrodes 130 that has openings 155 there through exposing the underlying insulative retaining material 120. Thereafter, any residual portion of the self-assembled polymer layer 160 may be removed.

The patterning process can include a dry plasma etching process. The process composition is chosen to selectively etch the collar layer 140, while minimally etching the self-assembled polymer layer 160 and the underlying insulative retaining material 120. As an example, when anisotropically etching silicon nitride, a dry plasma etching process using, for example, a halocarbon or halomethane gas (e.g., $C_xF_yH_z$, where x and y are real numbers greater than zero, and z is a real number greater than or equal to zero).

Once the collar layer structure 145 is prepared, at least part of the insulative retaining material 120, and optionally the insulative filling material 132, is removed through the openings of open pattern 155 in the collar layer structure 145. Although not shown, thereafter, a capacitor dielectric layer can be formed over the plurality of capacitor electrodes 130 to serve as the capacitor dielectric. And, at least one second capacitor electrode can be formed over the capacitor dielectric layer to complete the capacitor structure.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of forming a capacitor structure, comprising:
   providing a substrate having a plurality of capacitor electrodes formed within an insulative retaining material, the substrate further including a collar layer in contact with the plurality of capacitor electrodes;
   preparing a self-assembled polymer layer on the collar layer, the self-assembled polymer layer having a first domain phase-separated from a second domain;
   selectively removing the first domain of the self-assembled polymer layer while retaining the second domain of the self-assembled polymer layer to form an unguided, random self-assembly pattern on the substrate; and
   transferring the unguided, random self-assembly pattern into and through the collar layer to create a collar layer structure interconnecting the plurality of capacitor electrodes that has openings there through exposing the underlying insulative retaining material.

2. The method of claim 1, further comprising:
   removing at least part of the insulative retaining material through the openings in the collar layer structure.

3. The method of claim 2, further comprising:
   forming a capacitor dielectric layer over the plurality of capacitor electrodes; and
   forming at least one second capacitor electrode over the capacitor dielectric layer.

4. The method of claim 1, wherein at least one of the plurality of capacitor electrodes has a cylindrical shape characterized by a diameter and a height.

5. The method of claim 4, wherein an aspect ratio of the at least one capacitor electrode, measured as the ratio of the height to the diameter, exceeds 5-to-1.

6. The method of claim 1, wherein at least one of the plurality of capacitor electrodes is composed of TiN.

7. The method of claim 1, wherein at least one of the plurality of capacitor electrodes is a cylindrically shaped can having an outer sidewall and a bottom, the cylindrically shaped can being characterized by a diameter and a height.

8. The method of claim 1, wherein the insulative retaining material is homogeneous or non-homogeneous.

9. The method of claim 1, wherein the insulative retaining material is silicon oxide or polycrystalline silicon.

10. The method of claim 9, wherein the collar layer is silicon nitride.

11. The method of claim 1, wherein the first domain of the self-assembled polymer is poly(meth methacrylate), and the second domain of the self-assembled polymer is polystyrene.

12. The method of claim 1, wherein the substrate further includes one or more intermediate layers disposed between the collar layer and the self-assembled polymer layer.

13. A capacitor structure, comprising:
   a substrate having a plurality of capacitor electrodes formed within an insulative retaining material, and a collar layer structure in contact with the plurality of capacitor electrodes,
   wherein the collar layer structure interconnects the plurality of capacitor electrodes and exposes the underlying insulative retaining material through openings having an unguided, random self-assembly pattern.

14. The capacitor structure of claim 13, wherein at least one of the plurality of capacitor electrodes has a cylindrical shape characterized by a diameter and a height.

15. The capacitor structure of claim 14, wherein an aspect ratio of the at least one capacitor electrode, measured as the ratio of the height to the diameter, exceeds 5-to-1.

16. The capacitor structure of claim 13, wherein at least one of the plurality of capacitor electrodes is composed of TiN.

17. The capacitor structure of claim 13, wherein the insulative retaining material is homogeneous or non-homogeneous.

18. The capacitor structure of claim 13, wherein the insulative retaining material is silicon oxide or polycrystalline silicon.

19. The capacitor structure of claim 18, wherein the collar layer is silicon nitride.

20. A capacitor structure, comprising:
   a substrate having a plurality of capacitor electrodes and a collar layer structure in contact with the plurality of capacitor electrodes,
   wherein the collar layer structure interconnects the plurality of capacitor electrodes while providing openings there through having an unguided, random self-assembly pattern.

* * * * *